United States Patent
Bala et al.

(10) Patent No.: US 11,831,153 B1
(45) Date of Patent: Nov. 28, 2023

(54) HIGH-BANDWIDTH SIGNAL DRIVER/RECEIVER

(71) Applicant: Cadence Design Systems, Inc., San Jose, CA (US)

(72) Inventors: Phalguni Bala, Bangalore (IN); Manjunath Karikatti, Bangalore (IN); Navin Kumar Mishra, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 571 days.

(21) Appl. No.: 16/940,679

(22) Filed: Jul. 28, 2020

Related U.S. Application Data

(63) Continuation-in-part of application No. 16/860,435, filed on Apr. 28, 2020, now abandoned.

(60) Provisional application No. 62/842,659, filed on May 3, 2019.

(51) Int. Cl.
*H02H 9/04* (2006.01)
*H01L 25/18* (2023.01)
*H03H 7/01* (2006.01)

(52) U.S. Cl.
CPC .......... *H02H 9/046* (2013.01); *H01L 25/18* (2013.01); *H03H 7/0115* (2013.01); *H03H 2210/026* (2013.01)

(58) Field of Classification Search
CPC ...... H02H 9/046; H01L 25/18; H03H 7/0115; H03H 2210/026
USPC ........................................................ 361/56
See application file for complete search history.

(56) References Cited

U.S. PATENT DOCUMENTS

| | | | |
|---|---|---|---|
| 6,351,173 B1 | 2/2002 | Ovens et al. | |
| 6,462,601 B1 | 10/2002 | Chang et al. | |
| 6,509,779 B2 | 1/2003 | Yue et al. | |
| 6,624,999 B1 | 9/2003 | Johnson | |
| 7,002,220 B1 | 2/2006 | Jin et al. | |
| 7,005,939 B2 * | 2/2006 | Zerbe | H04L 25/0292 336/200 |
| 7,009,826 B2 | 3/2006 | Ker et al. | |
| 7,274,244 B2 | 9/2007 | Fang et al. | |
| 7,505,238 B2 | 3/2009 | Woo et al. | |
| 7,768,306 B2 | 8/2010 | Chiu | |
| 7,804,671 B2 | 9/2010 | Cheng et al. | |
| 8,482,889 B2 | 7/2013 | Huang et al. | |
| 8,674,477 B2 | 3/2014 | Shi et al. | |
| 8,860,487 B2 | 10/2014 | Ma | |
| 8,929,159 B2 | 1/2015 | Jain et al. | |
| 8,947,840 B1 * | 2/2015 | Milirud | H02H 9/046 361/56 |
| 9,071,240 B2 | 6/2015 | Lin et al. | |

(Continued)

*Primary Examiner* — Dharti H Patel
(74) *Attorney, Agent, or Firm* — Mark Whittenberger, Esq.; Holland & Knight LLP

(57) ABSTRACT

A tuned single-coil inductor is implemented between a signal driver output and external contact of an ESD-protected integrated circuit (IC) die and more specifically between the parasitic capacitances of the signal driver and the contact-coupled ESD (electrostatic discharge) element to form a Pi ($\pi$) filter that enhances signaling bandwidth at the target signaling rate of the IC die. The signal driver may be implemented with output-stage data serialization circuitry disposed in series between source terminals of a thick-oxide drive transistor and a power rail to avoid explicit level-shifting circuitry between the relatively low core voltage domain and relatively high I/O voltage domain.

20 Claims, 2 Drawing Sheets

(56) References Cited

U.S. PATENT DOCUMENTS

| | | | |
|---|---|---|---|
| 9,093,977 B2 | 7/2015 | Jin et al. | |
| 9,197,199 B2 | 11/2015 | Huang et al. | |
| 9,577,616 B2 | 2/2017 | Moore et al. | |
| 9,780,085 B1 | 10/2017 | Chang et al. | |
| 9,917,588 B2 | 3/2018 | Blutman et al. | |
| 10,498,564 B2 * | 12/2019 | Jalali Far | H04L 25/12 |
| 2004/0155675 A1 * | 8/2004 | Zerbe | H01L 27/0251 |
| | | | 326/30 |
| 2009/0195946 A1 | 8/2009 | Kleveland | |
| 2010/0067154 A1 * | 3/2010 | Deng | H01L 23/60 |
| | | | 361/56 |
| 2010/0156498 A1 | 6/2010 | Bagepalli | |
| 2011/0049672 A1 * | 3/2011 | Okushima | H01L 27/0248 |
| | | | 257/E27.013 |
| 2015/0289360 A1 * | 10/2015 | Leong | H05K 1/181 |
| | | | 361/782 |
| 2017/0373493 A1 * | 12/2017 | Morf | H02H 9/046 |
| 2019/0253284 A1 * | 8/2019 | Jalali Far | H04L 25/03146 |

\* cited by examiner

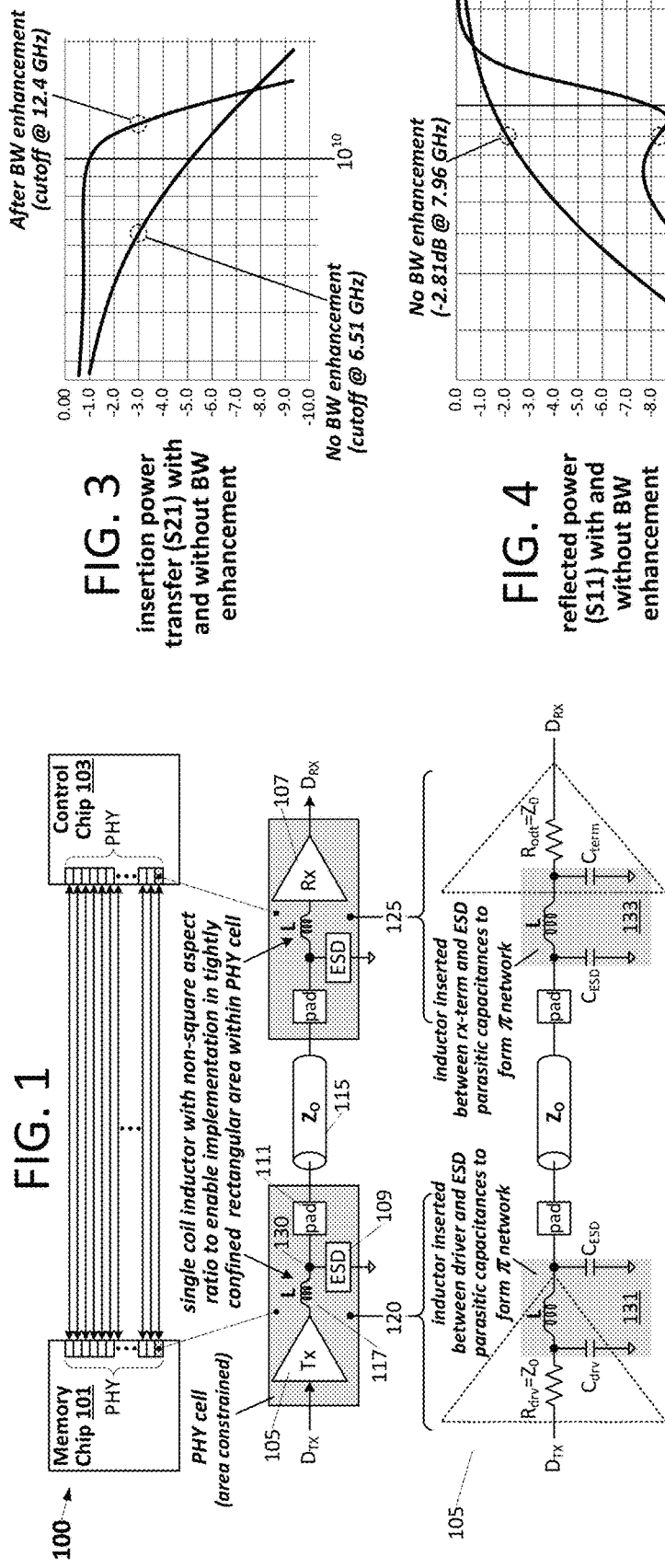
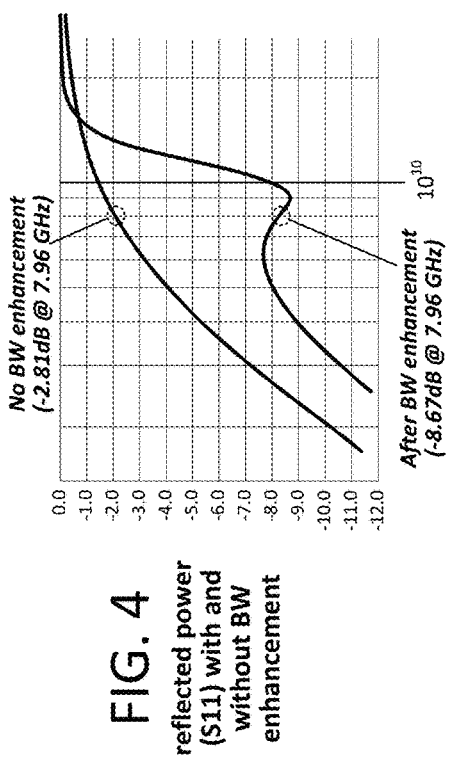
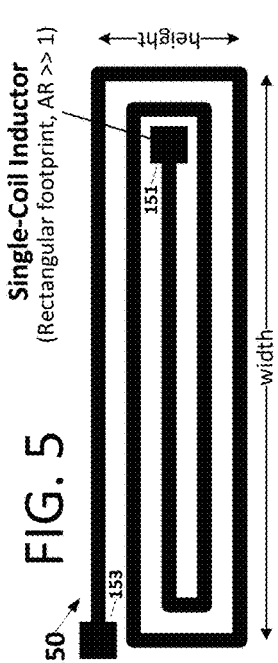
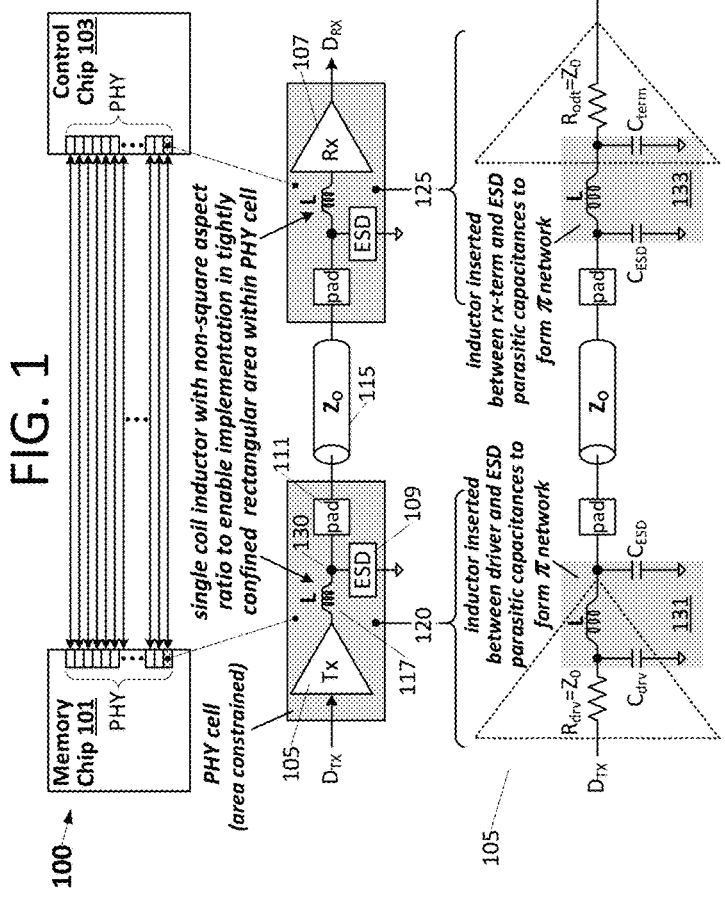
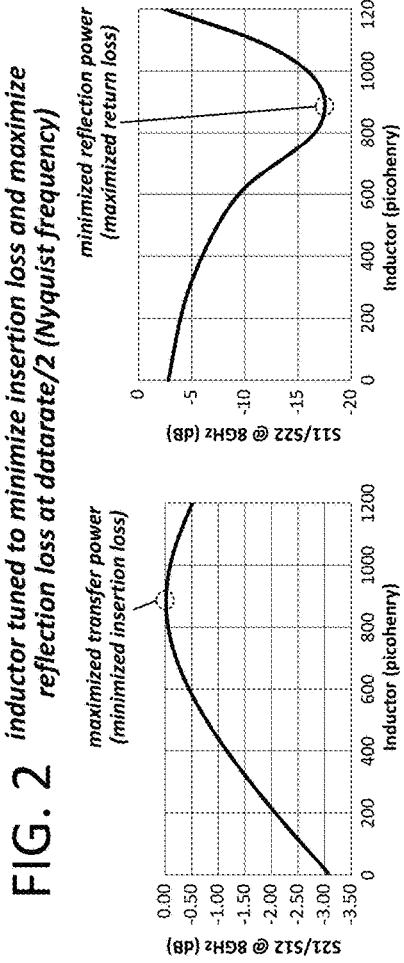

HIGH-BANDWIDTH SIGNAL DRIVER/RECEIVER

CROSS REFERENCE TO RELATED APPLICATIONS

This application is a continuation-in-part of U.S. application Ser. No. 16/860,435 filed Apr. 28, 2020, which claims the benefit of U.S. provisional application No. 62/842,659 filed May 3, 2019. Each of the foregoing patent applications is hereby incorporated by reference.

DRAWINGS

The various embodiments disclosed herein are illustrated by way of example, and not by way of limitation, in the figures of the accompanying drawings and in which like reference numerals refer to similar elements and in which:

FIG. 1 illustrates an exemplary signaling system in which respective physical signaling interfaces (PHYs) of link-coupled memory and memory-control ICs (integrated circuits) are populated by n-filter (Pi-filter) input/output (I/O) cells;

FIG. 2 illustrates insertion loss and return loss profiles resulting from sweeping the Pi filter inductance of FIG. 1 through a range of inductance values at a target signaling rate;

FIG. 3 illustrates insertion power transfer within the signaling system of FIG. 1 over a frequency range of interest with and without Pi-filter bandwidth enhancement;

FIG. 4 illustrates reflected power within the signaling system of FIG. 1 with and without Pi-filter bandwidth enhancement over the same frequency range as FIG. 3;

FIG. 5 illustrates an embodiment of a single-coil inductor that may be used to implement the bandwidth-enhancing inductor elements shown in FIG. 1;

Figure 6:
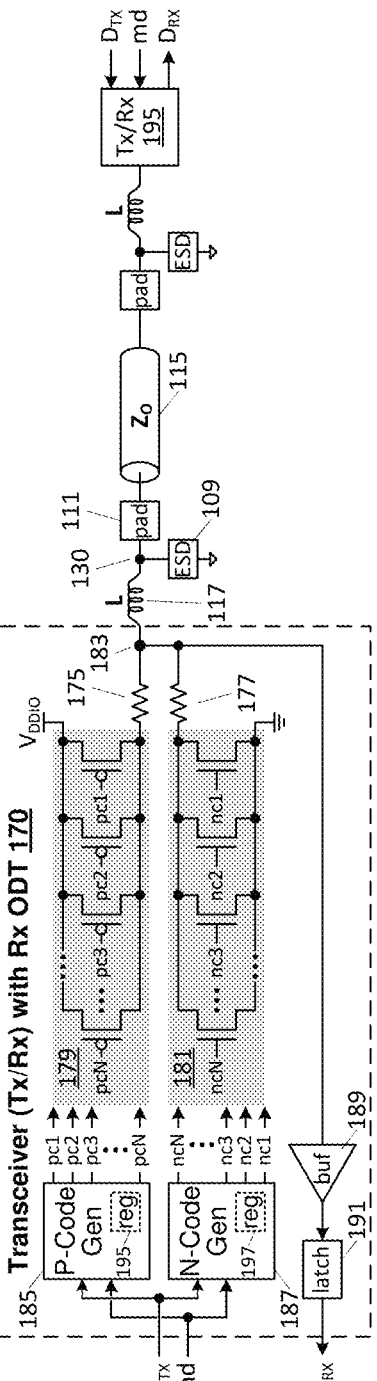
Figure 7:
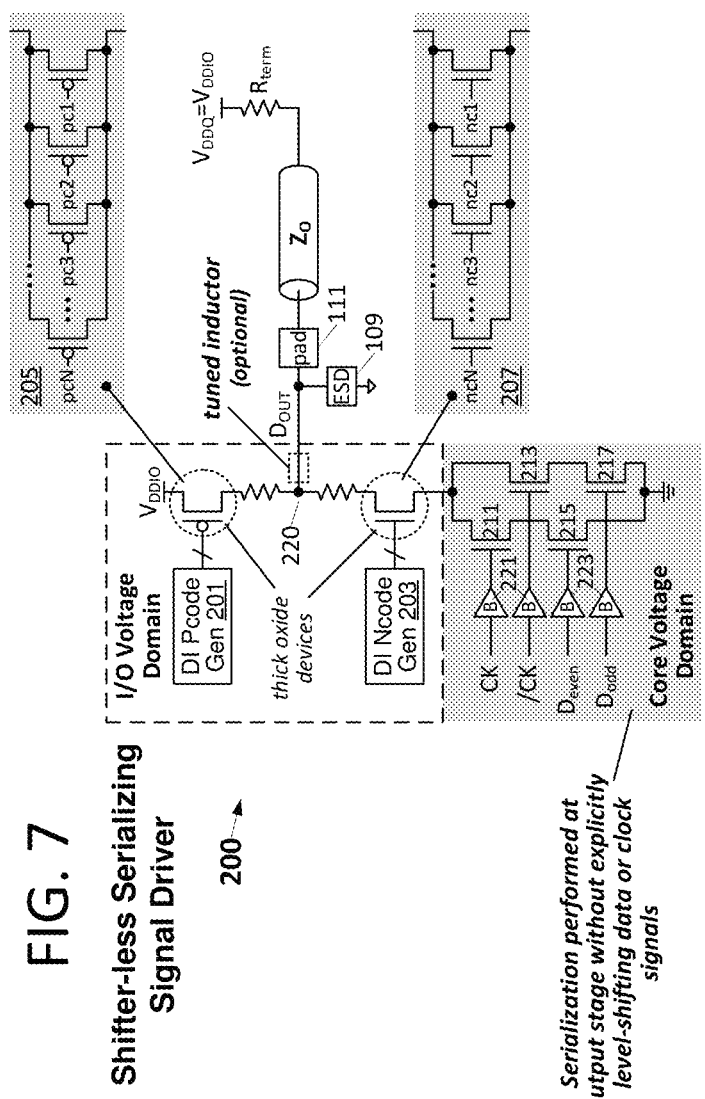

FIG. 6 illustrates an embodiment of a transceiver that may be deployed within the PHY cells of the memory-control and memory ICs of FIG. 1 to enable bi-directional signaling; and FIG. 7 illustrates an embodiment of a 2:1 serializing signal driver that produces an I/O-voltage-domain output signal on a driver I/O node without level-shifting the incoming transmit data signal at any internal node of the signal driver and also without level-shifting the I/O clock used to time signal transmission.

DETAILED DESCRIPTION

In various embodiments disclosed herein, a tuned single-coil inductor is implemented between a signal driver output and external contact of an ESD-protected integrated circuit (IC) die and more specifically between the parasitic capacitances of the signal driver and the contact-coupled ESD (electrostatic discharge) element to form a Pi (7Z) filter that enhances signaling bandwidth at the target signaling rate of the IC die. In a number of embodiments, a tuned single-coil inductor is also implemented between the parasitic capacitances of an ESD element and signal receiver (including link termination therein) of an IC die coupled to receive the signal transmitted by the bandwidth-enhanced transmit-side IC so that bandwidth-enhancing Pi filters are implemented within counterpart ICs on both sides of a chip-to-chip signaling link. In other embodiments, the bandwidth-enhancing inductor/Pi filter can be implemented only on the transmitting or receiving side of a signaling link rather than on both sides of the link—in the transmitter within one chip or the receiver within the counterpart chip. Where the signaling link is driven bidirectionally by the counterpart ICs (e.g., where one IC is a memory chip and the other is a memory control chip and the signaling link conveys read and write data signals therebetween), the signal driver and signal receiver are each components of a respective transceiver circuit (one transceiver on each IC die) having a tuned single-coil inductor coupled between the transceiver input/output (I/O) node and the contact-coupled ESD structure. In such embodiments, the signal driver component of the transceiver may serve double duty as an on-die termination (ODT) load during signal reception. In yet other embodiments, the signal driver may be implemented with output-stage data serialization circuitry disposed in series between source terminals of a thick-oxide drive transistor (or parallel set of such transistors) and a power rail—an arrangement that obviates explicit level-shifting circuitry between the relatively low core voltage domain and relatively high I/O voltage domain (i.e., the latter voltage domain powering a pull-up/pull-down pair of the thick-oxide drive transistors) and thus avoids the bandwidth—degrading duty cycle distortion otherwise incurred in level-shifting the serialized data signal prior to final transceiver output. These and other features and embodiments are presented in further detail below.

FIG. 1 illustrates an exemplary signaling system 100 in which respective physical signaling interfaces (PHYs) of link-coupled memory and memory-control ICs (101, 103) are populated by Pi-filter I/O cells. In the depicted embodiment, each PHY cell includes a signaling circuit (i.e., a signal driver 105, signal receiver 107 or signal transceiver), ESD element 109 and link-interconnect pad 111 (which may be any practicable structure for making conductive contact to off-chip signaling link 115), together with a single-coil inductor 117 coupled in series between pad 111 and the signaling circuit. In general, the individual PHY cells are area constrained by the limited space available for the PHY as a whole and/or the pitch of the chip-to-chip signaling links (i.e., pitch minimized to maximize signaling link quantity), rendering deployment of relatively large multiple-coil structures (e.g., transformer elements and the like) impractical. In a number of embodiments, the single-coil inductor is implemented with a non-unity aspect ratio (i.e., width substantially different from height) to enable layout within a compact rectangular area (i.e., relatively broad/wide but narrow/short) bounded by other components of the PHY cell. Moreover, referring to the elemental model of driver PHY cell shown at 120 (which may implement a transceiver as discussed below), signal driver 105 is implemented with an output impedance ($R_{drv}$) nominally matched to the link impedance ($Z_O$) to enable maximum energy transfer from the driver to the link during each signal drive interval (i.e., each "bit interval" in a data bit transmission or each symbol interval where multiple bits are encoded into each symbol transmission). However, as signaling frequencies rise toward and above 10 Gbps (gigabits per second), insertion loss increases and return loss decreases (less energy transferred and more energy reflected—the opposite of desired result), degrading signal integrity and effectively limiting achievable signaling bandwidth. Similarly, though the receive side termination impedance (R& as shown in model 125) nominally matches the link impedance (to enable maximum energy transfer from the link to the signal receiver during each bit interval/symbol interval), insertion loss increases substantially (and return loss substantially decreases) at signaling rates near and above 10 Gbps, shrinking the timing and voltage margin for signal reception and thus lowering the bandwidth ceiling.

Still referring to FIG. 1, connecting the single-coil inductor 117 in line between output of driver 105 and signal-link interconnect 111 and more specifically between the driver output and the connection point (130) of the ESD element yields a Pi filter (as shown at 131 in model 120) that can be tuned to maximize transfer power and minimize reflected power (i.e., minimizing insertion loss and maximizing return loss) at the Nyquist frequency of the signaling network—that is, at half the data rate (bit rate/2 or symbol rate/2). Inductor insertion between the ESD-element connection point and on-die termination (R&) within signal receiver 107 similarly yields a tunable Pi filter (as shown at 133 in model 125). For example, the parasitic capacitances of a signal driver (and receive-side termination) and ESD element may be extracted from a given PHY cell implementation and used to analyze signaling performance over a range of inductances (i.e., of an inductor 117 deployed to form Pi networks shown at 131 and 133) at the Nyquist frequency of a target signaling rate.

FIG. 2 illustrates insertion loss and return loss profiles resulting from such performance analysis (sweeping the Pi filter inductance from 0 to 1200 picohenry at a target signaling rate of 16 Gbps and thus an 8 GHz Nyquist frequency), showing that a single-coil inductor (117) tuned to approximately 880 picohenrys will yield a nominally minimized insertion loss and maximized return loss. Higher or lower inductance values, including inductances over 1000, 2000, 5000 or more picohenrys, may be optimal in other embodiments, particularly where different signaling rates and/or different ESD/driver/termination parasitics apply. FIG. 3 illustrates insertion power transfer (scattering parameter S21 and thus power transfer from transmitter to signaling link) with and without Pi-filter bandwidth enhancement over a gigahertz frequency range (shown in logarithmic scale) that traverses the 8 GHz Nyquist frequency of a 16 Gbps target signaling rate. Without bandwidth enhancement (i.e., lacking the tuned single-coil inductor shown at 117 in FIG. 1), insertion loss increases rapidly above a few GHz, reaching the −3 dB cutoff at 6.51 GHz and thus at a frequency well below the target Nyquist frequency (8 GHz in this example). By contrast, adding the tuned single-coil inductor as shown in FIG. 1 reduces the insertion loss dramatically—less than −1 dB at the target Nyquist frequency—with headroom to spare, not reaching the −3 dB cutoff until 12.4 GHz. FIG. 4 illustrates reflected power (scattering parameter S11 and thus power reflected to the signal driver) with and without Pi-filter bandwidth enhancement over the same frequency range as FIG. 3, showing that deployment of the tuned single-coil inductor (117) significantly attenuates reflected power (maximizes return loss) at frequencies near the 8 GHz Nyquist frequency target relative to implementations without added inductor (i.e., −8.67 dB with bandwidth-enhancing inductor, versus −2.81 dB without inductor).

FIG. 5 illustrates an embodiment of a single-coil inductor 150 that may be used to implement the bandwidth-enhancing inductor elements (117) shown in FIG. 1. In the depicted example, inductor 150 is formed by a coiled trace having a substantially greater width than height (width and height referring to arbitrary orthogonal axes in a substantially planer layout) and thus an aspect ratio significantly greater than one (AR>>1). In more specific examples, the aspect ratio may be greater than 2, 3, 4, 5, 10, 20 or more. Also, while a rectangular coil with four bends is shown, more or fewer bends (and thus more or fewer windings) may be provided as necessary to supply a target (tuned) inductance value. Also, while through-oxide vias for connecting between metal layers are supplied at interior (151) and exterior ends (153) of the coil (one to be coupled to the PHY-cell signaling circuit and the other to the link-interconnect pad), a via (or other structure for coupling one metal layer to another) may be supplied only at the interior terminus of the coil (i.e., 151). Further, while the coil is depicted as having two right angle bends to achieve each reversed routing direction, contoured turns or obtuse-angle turns may be used instead such that the footprint of the inductor is elliptical, hexagonal, octagonal, etc. rather than rectangular.

Returning briefly to FIG. 1, the depicted bandwidth-enhancement technique may be employed in various chip-to-chip signaling arrangements other than the memory-control IC to memory IC shown. For example, the memory IC may instead be a register-clock-driver (RCD) IC (as on a registered memory module), buffer component or the like. The two ICs (memory and memory control) may instead be (or include) respective and counterpart serializing/deserializing (SERDES) components disposed on opposite sides of a signaling link, and so forth. In all cases, the signaling links themselves may be single-ended (e.g., in respective sets of data signaling links between memory ICs/buffer ICs and a memory control IC) or differential (e.g., between ICs having SERDES on opposite sides of a signaling link).

FIG. 6 illustrates an embodiment of a transceiver 170 that may be deployed within the PHY cells of the memory-control and/or memory ICs of FIG. 1 (i.e., within PHY cells of both ICs, within PHY cells of the memory-control IC only, or within PHY cells of the memory IC only) to enable bi-directional signaling over a given signaling link (e.g., memory IC receiving write data transmitted by memory control IC, and memory control IC receiving read data transmitted by memory IC). In the CMOS (complementary metal oxide semiconductor) implementation shown, pull-up and pull-down resistance elements (175 and 177, respectively) are coupled in series between a set of p-type MOS drive transistors (PMOS) 179 and a counterpart set of n-type MOS drive transistors (NMOS) 181, with the connection point between resistors 175 and 177 forming a transceiver I/O node 183 coupled, via tuned single-coil inductor 117, to link interconnect pad 111 (and to connection point 130 of ESD element 109). The source terminals of the PMOS drive transistors 179 are coupled to an I/O voltage rail ($V_{DDIO}$) and the source terminals of NMOS drive transistors 181 are coupled to a ground voltage rail. During a signal drive interval (i.e., when transceiver 170 is serving as a signal driver), a predetermined number (1 to N) of either the PMOS drive transistors 179 or the NMOS drive transistors are switched on in response to control signals (pc1 to pcN) from P-code generator 185 or control signals (nc1 to ncN) from N-code generator 187, respectively, to switchably couple transceiver I/O node 183 to $V_{DDIO}$ via resistive element 175 or to ground via resistive element 177 and thereby pull the I/O node up or down. In one embodiment, the P-code and N-code generators (185, 187) respond to a drive-enable state of mode signal "md" (i.e., logic state indicating a signal drive interval) by asserting active low control signals to the predetermined number of PMOS transistors or asserting active high control signals to the predetermined number of NMOS transistors according to the logic state of the data bit to be transmitted ($D_{TX}$). More specifically, in an active-low driver embodiment, N-code generator 187 will respond to a logic '1' $D_{TX}$ bit by raising some number (at least one) of the NMOS-transistor control signals (i.e., nc1, nc2, . . . , ncN) to effect a relatively low voltage output at transceiver I/O node 183, and, conversely, P-code generator 185 will respond to a logic '0' $D_{TX}$ bit by lowering some number (at least one) of the PMOS-transistor control signals (i.e., pc1, pc2, . . . , pcN) to effect a relatively high voltage output at the transceiver I/O node. The quantity and pattern of the control signals asserted by the P-code and N-code generators may be established during calibration operations to effect an optimized signal drive strength (the control signal pattern being relevant in implementations in which the transconductance of individual drive transistors (i.e., within PMOS set 179 or NMOS set 181) coupled to receive respective control signals is non-uniform either due to implementation by varying numbers of gate-coupled transistors, physically differently sized transistors or both—as in the case of binary-weighted transistor sizing.

Continuing with FIG. 6, when mode signal (md) indicates a signal reception interval within transceiver 170, P-code generator 179 and N-code generator 181 each assert control signals in a predetermined pattern to effect a calibrated termination impedance (an on-die termination) with respect to signaling link 115. In one implementation, for example, a number of PMOS drive transistors 179 are switched on (in response to active-low control signals from P-code generator 185) and a counterpart (but not necessarily equal) number of NMOS drive transistors 181 are switched on (in response to active-high control signals from N-code generator 187) to effect nominally balanced pull-up and pull-down impedances between transceiver I/O node 183 and the I/O supply voltage rails ($V_{DDIO}$ and ground, respectively) or more generally termination to any desired voltage between $V_{DDIO}$ and ground. In other embodiments, termination may be implemented through pull-up elements exclusively or pull-down elements exclusively (i.e., pull-up only with some number of PMOS drive transistors 179 switched on while NMOS drivers 181 are all switched off, and vice-versa for pull-down only). Signals arriving on the terminated link are conditioned within buffer/preamplifier 189 (e.g., shifted to MOS logic levels) to enable bits of information conveyed in the signals to be latched within latch element 191 and forwarded to core logic circuitry within the host IC. Note that while transceiver 170 operates in receive mode, counterpart transceiver 195 (implemented in another IC) operates in transmit mode and vice-versa. The counterpart transceivers 170 and 195 may be identically implemented, though signal drive strength and on-die termination impedances may be set to different levels according to calibration values stored, for example, within registers 195 and 197 of code generators 185 and 187 (such calibration values being established at initial power-up and periodically/occasionally adjusted thereafter).

Still referring to FIG. 6, the I/O voltage supplied to power the transceiver drive stage is substantially higher than the core logic voltage (e.g., $V_{DDIO}$ in the range of 1.2-1.5 v versus ~0.8v core logic voltage ($V_{DD}$)), and parallel data within the core domain is typically serialized prior to transmission (and deserialized after reception). As chip-to-chip signaling rates approach/exceed 10 GHz, the duty-cycle distortion resulting from conventional pre-driver level-shifting (i.e., from the core voltage domain to the I/O voltage domain) consumes an intolerably large part of the signal timing budget. Data-dependent supply noise induces jitter in the pre-driver (i.e., circuitry to drive fast-slew signals to the output stage transistors) that further shrinks timing and voltage margins, and both effects (duty-cycle distortion from level-shifting and data-dependent noise) may be aggravated by data serialization at earlier stages. For example, a 2:1 serialization conventionally implemented in the core voltage domain just prior to level-shifting to the $V_{DDIO}$ domain (i.e., serializing respective pairs of parallel bits during each I/O clock cycle such that one bit is transmitted on the even phase of an I/O clock cycle and the other is transmitted on the odd phase of the same clock cycle and thus "even" and "odd" data) serializes the even and odd data, forming an eye width equal to half the clock cycle. Consequently, any duty cycle distortion or noise-induced jitter imparted by downstream circuit operation (e.g., level-shifter and pre-driver) can consume a large portion of the timing budget with respect to a serializing signal driver.

FIG. 7 illustrates an embodiment of a 2:1 serializing signal driver 200 that produces a $V_{DDIO}$-domain output signal on the driver I/O node (i.e., signal that swings between voltage levels at or near the rail voltages of the $V_{DDIO}$ supply) without level-shifting the transmit data signal at any internal node of the driver and also without level-shifting the I/O clock. In the depicted embodiment, data-independent P-code and N-code generators 201, 203 apply steady-state sets of drive-transistor control signals to PMOS transistor set 205 and NMOS transistor set 207, respectively (i.e., each set being implemented generally as described with respect to transistor sets 179 and 181 of FIG. 6), while incoming core-voltage-domain data and clock signals are used to selectively enable pull-down operation within NMOS transistor set 207 according to the value of the data bit supplied by core logic circuitry. More specifically, during the high phase of I/O clock (CK), transistor 211 will be switched on (and transistor 213 switched off in response to complement-clock signal,/CK) so that the source terminals of NMOS transistor set 207 will be switchably coupled to ground via transistor 215 in response to a logic high $D_{even}$ bit, pulling I/O node 220 to a desired voltage below the midpoint between $V_{DDIO}$ and ground. A logic low $D_{even}$ bit, by contrast, will float the source terminals of NMOS transistor set 207 (i.e., by switching off transistor 215) so that no pull-down current will flow and I/O node 220 will instead be pulled up to a desired voltage above the midpoint between $V_{DDIO}$ and ground by operation of the enabled (switched-on) transistors within PMOS transistor set 205—a pseudo-open-drain voltage swing about a desired center voltage, with both the swing amplitude and the center voltage established by signaling calibration operations (i.e., to program one or more registers within or coupled to code generators 201, 203 and thus establish pull-up/pull-down current amplitudes within transistor sets 205 and 207). Odd-phase data transmission is identical to the even-phase transmission, with/CK switching on transistor 213 and pull-down being selectively enabled or blocked according to the '1'/'0' state of $D_{odd}$ (i.e., switching transistor 217 on or off to drive a relatively low or high voltage signal, respectively, at I/O node 220.

Signal driver 200 provides a number of benefits over more conventional level-shift/pre-driver designs. For one, the I/O clock is maintained exclusively in the core voltage domain and, except for final output (at driver I/O node 220), the data signal is likewise maintained exclusively in the core voltage domain, thus avoiding level-shift-induced duty-cycle distortion and the concomitant loss of timing margin. Also, because pre-drivers within the I/O voltage domain are omitted altogether (optional buffer elements 221, 223 are powered by the core logic supply) and the gate control signals supplied by code generators 201, 203 to constituent drive transistors within PMOS and NMOS transistor sets 205, 207 remain static throughout a data transmission burst, data-dependent noise is significantly reduced, further improving signal timing and voltage margins. Data-dependent noise may be further reduced or avoided altogether by separating core power supplies to the data path (e.g., powering buffer elements 221) and clock path (e.g., powering buffer elements 223). Also, because serialization is carried out in the final output stage without requiring additional thick-oxide drive transistors, complications from early-stage serialization are avoided without increasing the output stage area footprint (i.e., as would occur upon implementation of additional thick-oxide drive transistors to drive node 220 on alternating phases of the I/O clock). Although not specifically shown, the data-independent Pcode and Ncode generators 201, 203 may respond to a mode signal to implement (within transistor sets 205 and 207) on-die termination so that signal driver 200 constitutes part of a transceiver coupled to I/O node 220. Also, as shown a tuned single-coil inductor may be disposed in series between I/O node 220 and pad 111, to form (along with driver/on-die-termination parasitic capacitance and parasitic capacitance of ESD element 109) a bandwidth-enhancing Pi filter targeted to a desired signaling rate.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, the PHY cells and component circuits thereof may be implemented in various integrated circuit devices other than memory and memory control ICs. The various signaling rates and related frequencies (e.g., Nyquist frequencies) are provided for purposes of example only—higher and lower rates, frequencies, etc. may be implemented in all cases. Similarly, component sizes, characteristics and quantities (including inductance values, capacitance values, resistance values, etc.), voltage supply values, etc. may be higher/lower or otherwise different from those described in alternative embodiments. Additionally, links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. Circuit functions implemented with PMOS transistors may be implemented instead with NMOS transistors (and vice-versa), with appropriate changes in transistor source connections (e.g., to opposite polarity voltage rails). A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit die comprising:
   a contact to be coupled to an external signaling link;
   an electrostatic discharge (ESD) element connected to the contact;
   a signaling circuit having:
   an input to receive a first control signal that specifies, during respective intervals, a link driver mode and a link termination mode, and
   circuitry to generate an information-bearing signal on an input/output (I/O) node of the signaling circuit in response to specification of the link driver mode, and to couple a termination impedance to the I/O node in response to specification of the link termination mode; and
   a conductor coiled to form an inductor having (i) a first end connected to the I/O node of the signaling circuit and a second end connected to the contact, and (ii) a predetermined inductance that forms, together with parasitic capacitances of the signaling circuit and the ESD element, a tuned filter that improves a frequency response of signals conveyed between the I/O node of the signaling circuit and the contact.

2. The integrated circuit die of claim 1 wherein the tuned filter formed by the inductor and the parasitic capacitances comprises a Pi (π) filter.

3. The integrated circuit die of claim 1 wherein the inductance of the inductor formed by the coiled conductor is less than 2000 picohenrys.

4. The integrated circuit die of claim 1 wherein the inductor formed by the coiled conductor has a rectangular footprint with a non-square aspect ratio.

5. The integrated circuit die of claim 4 wherein the aspect ratio of the inductor is greater than two.

6. The integrated circuit die of claim 1 wherein the inductor formed by the coiled conductor has an elliptical footprint.

7. The integrated circuit die of claim 1 wherein the tuned filter formed by the inductor and the parasitic capacitances increases return loss with respect to signals conveyed from the I/O node of the signaling circuit to the contact by more than two orders of magnitude.

8. The integrated circuit die of claim 1 wherein the tuned filter formed by the inductor and the parasitic capacitances increases −3 dB cutoff frequency of signals conveyed from the I/O node of the signaling circuit to the contact by more than 4 GHz.

9. The integrated circuit die of claim 1 wherein the signaling circuit comprises:
p-type MOS (PMOS) drive transistors having source terminals coupled to an I/O supply voltage node and drain terminals coupled to the I/O node;
n-type MOS (NMOS) drive transistors having drain terminals coupled to the I/O node;
first and second switching transistors coupled in series between a ground voltage node and source terminals of the NMOS drive transistors, the first switching transistor having a gate terminal coupled to receive a clock signal and the second switching transistor having a gate terminal coupled to receive a first data signal; and
third and fourth switching transistors also coupled in series between the ground voltage node and the source terminals of the NMOS drive transistors, the third switching transistor having a gate terminal coupled to receive a complement of the clock signal and the fourth switching transistor having a gate terminal coupled to receive a second data signal.

10. The integrated circuit device of claim 9 wherein the drain terminals of the PMOS drive transistors are coupled to the I/O node via a first resistive element and the drain terminals of the NMOS drive transistors are coupled to the I/O node via a second resistive element.

11. The integrated circuit device of claim 9 wherein the signaling circuit further comprises a control signal generator that outputs respective transistor control signals to the gate terminals of the PMOS drive transistors and a second control signal generator that outputs respective transistor control signals to the gate terminals of the NMOS drive transistors, wherein the transistor control signals output to the gate terminals of the PMOS drive transistors and the transistor control signals output to the gate terminals of the NMOS drive transistors have predetermined states independent of the first and second data signals.

12. The integrated circuit device of claim 9 wherein the clock signal, the complement of the clock signal and the first and second data signals are bi-stable signals that swing between a core logic supply voltage and ground, and wherein the core logic supply voltage is lower than an I/O supply voltage generated on the I/O supply voltage node.

13. The integrated circuit device of claim 12 wherein the I/O supply voltage is at least 50% greater than the core logic supply voltage.

14. An integrated circuit die comprising:
a contact to be coupled to an external signaling link;
an electrostatic discharge (ESD) element connected to the contact; and
a signaling circuit operable in a link driver mode to generate an information-bearing signal on an input/output (I/O) node of the signaling circuit, and operable in a link termination mode to couple a termination impedance to the I/O node, the signaling circuit having:
p-type MOS (PMOS) drive transistors having source terminals coupled to an I/O supply voltage node and drain terminals coupled to the I/O node of the signaling circuit;
n-type MOS (NMOS) drive transistors having drain terminals coupled to the I/O node of the signalling circuit;
first and second switching transistors coupled in series between a ground voltage node and source terminals of the NMOS drive transistors, the first switching transistor having a gate terminal coupled to receive a clock signal and the second switching transistor having a gate terminal coupled to receive a first data signal; and
third and fourth switching transistors also coupled in series between the ground voltage node and the source terminals of the NMOS drive transistors, the third switching transistor having a gate terminal coupled to receive a complement of the clock signal and the fourth switching transistor having a gate terminal coupled to receive a second data signal.

15. The integrated circuit die of claim 14 further comprising a conductor coiled to form an inductor having (i) a first end connected to the I/O node of the signaling circuit and a second end connected to the contact, and (ii) a predetermined inductance that forms, together with parasitic capacitances of the signaling circuit and the ESD element, a tuned filter that improves a frequency response of signals conveyed from the I/O node of the signaling circuit to the contact.

16. The integrated circuit die of claim 14 wherein the tuned filter formed by the inductor and the parasitic capacitances of the ESD element and the signaling circuit comprises a Pi (π) filter.

17. The integrated circuit die of claim 14 wherein the inductor formed by the coiled conductor has a rectangular footprint with a non-square aspect ratio.

18. The integrated circuit die of claim 14 wherein the signaling circuit comprises circuitry to toggle between the link termination mode and the link driver mode in response to a mode control signal.

19. The integrated circuit die of claim 14 wherein the signaling circuit further comprises a first control signal generator that outputs respective control signals to the gate terminals of the PMOS drive transistors and a second control signal generator that outputs respective control signals to the gate terminals of the NMOS drive transistors, wherein the control signals output to the gate terminals of the PMOS drive transistors and the control signals output to the gate terminals of the NMOS drive transistors have predetermined states independent of the first and second data signals.

20. An integrated circuit die comprising:
means for making electrical contact with an external signaling link;
means for discharging an electrostatic voltage source applied to the means for making electrical contact, the means for discharging having a terminal connected to the means for making electrical contact;
a signaling circuit having;
   an input/output (I/O) node,
   means for receiving a first control signal that specifies, during respective intervals, a link driver mode and a link termination mode, and
   means for generating an information-bearing signal on the I/O node in response to specification of the link driver mode and for coupling a termination impedance to the I/O node in response to specification of the link termination mode; and
a conductor coiled to form an inductor having (i) a first end connected to the I/O node of the signaling circuit and a second end connected to the means for making contact, and (ii) a predetermined inductance that forms, together with parasitic capacitances of the signaling circuit and the means for discharging the electrostatic voltage source, a tuned Pi ($\pi$) filter that improves a frequency response of signals conveyed between the I/O node of the signaling circuit and the means for making electrical contact.

* * * * *